(12) United States Patent
Kleihorst et al.

(10) Patent No.: US 7,019,527 B2
(45) Date of Patent: Mar. 28, 2006

(54) COMBINER/SPLITTER DEVICE FOR AN MRI SYSTEM

(75) Inventors: Robert Paul Kleihorst, Eindhoven (NL); Eerke Holle, Eindhoven (NL); Andreas Henricus Wilhelmus Snelders, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/508,220

(22) PCT Filed: Feb. 25, 2003

(86) PCT No.: PCT/IB03/00720

§ 371 (c)(1),
(2), (4) Date: Sep. 20, 2004

(87) PCT Pub. No.: WO03/081272

PCT Pub. Date: Oct. 2, 2003

(65) Prior Publication Data

US 2005/0116711 A1     Jun. 2, 2005

(30) Foreign Application Priority Data

Mar. 21, 2002   (EP) .................................. 02076106

(51) Int. Cl.
*G01V 3/00*         (2006.01)
(52) U.S. Cl. ...................................... 324/322; 324/318

(58) Field of Classification Search ................ 324/322, 324/318, 319, 320, 300
See application file for complete search history.

(56) References Cited

U.S. PATENT DOCUMENTS

| 4,922,204 | A | * | 5/1990 | Duerr et al. ................. 324/322 |
| 4,931,734 | A |   | 6/1990 | Kemner et al. |
| 5,229,724 | A |   | 7/1993 | Zeiger |
| 5,296,814 | A |   | 3/1994 | Lyle |
| 6,847,210 | B1 | * | 1/2005 | Eydelman et al. .......... 324/318 |

FOREIGN PATENT DOCUMENTS

| EP | 0 196 134 A1 | 10/1986 |
| EP | 0 469 670 A2 | 2/1992 |
| EP | 0 890 848 A1 | 1/1999 |
| JP | 62-231145 | 10/1987 |

\* cited by examiner

*Primary Examiner*—Louis M. Arana
(74) *Attorney, Agent, or Firm*—Thomas M. Lundin

(57) ABSTRACT

A combiner/splitter device (100) comprises two transmission lines (23, 24), wound to form a helical coil (55), this helical coil being bent to a toroidal shape. Furthermore, a capacitor (51) is provided, connected in parallel with the two outer conductors (25, 26) of the two transmission lines (23, 24). The combination of the wound transmission lines and said capacitor forms a parallel resonator (56). The combiner/splitter device is suitable for use in a magnetic resonance imaging (MRI) system to combine the output signals of a receiver coil system and/or to split the input signal of a transmission coil system used in the MRI system.

14 Claims, 5 Drawing Sheets

COMBINER/SPLITTER DEVICE FOR AN MRI SYSTEM

The invention relates to a combiner/splitter device comprising a first transmission line, which has an inner conductor and an outer conductor having a first end and a second end, a second transmission line, which has an inner conductor and an outer conductor having a first end and a second end, wherein the two first ends of the two transmission lines are electrically connected to each other and the two second ends of the two transmission lines are electrically connected to each other.

The invention further relates to a magnetic resonance imaging (MRI) system comprising an examination volume, a main magnet system for generating a main magnetic field in the examination volume, a gradient magnet system for generating gradients of the main magnetic field, a transmission and/or receiver coil system, and a combiner/splitter device to combine at least two output signals of the coil system and/or to split an input signal of the coil system.

Hereinafter, the invention will first be explained specifically for a combiner device. However, as will be made clear, the same inventive principles also apply to a splitter device.

In the magnetic resonance imaging technique, a high frequency magnetic field is applied to a body under examination, such as for instance a human body, by means of a transmission coil system of the MRI system. Nuclei of the tissue in this body are excited. After excitation, the nuclei return to their equilibrium state, and in this process they transmit an electromagnetic field, indicated as free induction decay signal (FID). This FID signal is received by a receiver coil system of the MRI system, and from this received FID signal MR images can be derived. Since the MR imaging technique is well known per se, while in addition the present invention does not relate to the MR imaging technique as such, the MR imaging technique and the known parts of the MRI system, in particular the examination volume, the main magnet system, and the gradient magnet system, will not be explained here in more detail.

Not only the nuclei which have been excited by a transmitter coil generate an FID signal. Due to thermal energy, all nuclei inside the body will generate an FID signal, which is, however, not correlated to the transmitted field signal and which can be considered as noise. In order to improve the signal/noise ratio, it is common practice to use quadrature coils, both for transmission and for reception. A quadrature coil system comprises two coils having their coil axes directed perpendicularly with respect to each other. In the quadrature transmission coil system, alternating currents are applied to both coils, these two currents having the same frequency but having a phase relationship of 90° with respect to each other. Thus, a rotating magnetic field is generated by the quadrature transmission coil system. Likewise, nuclei excited by this rotating field will, upon decay, induce electromotive forces in the two coil elements of the quadrature receiver coil system, these electromotive forces also having a phase relationship of 90° with respect to each other. In contrast, thermal nuclei will induce random noise in both receiver coil elements.

In order to process the output signals of the two receiver coils of a quadrature receiver coil system, the leading signal is delayed over 90°, and the delayed leading signal is added to the trailing signal. Signal components having a 90° phase relationship will now add up to double signal strength. Noise components having a random phase relationship will substantially average out on adding. For combining the two output signals in this way, an MRI apparatus comprises a combiner device.

FIGS. 1A–C illustrate several prior art combiner devices. The prior art combiner device 1 illustrated in FIG. 1A is built from discrete components, i.e. inductors, resistors and capacitors. A first input 2 is intended for receiving a first input signal from a first receiver coil (not shown) and a second input 3 is intended for receiving the output signal from a second receiver coil (also not shown), the second signal having the same frequency as the first signal but having a phase shift of 90° with respect to the first signal. The combiner device 1 has a first output 4 for providing an enhanced output signal, and a second output 5 coupled to ground through a first resistor 6, having a characteristic resistance of 50 Ohm.

The first input 2, the second input 3, the first output 4 and the second output 5 are coupled to ground through respective capacitors 7, 8, 9, 10. The first and second inputs 2 and 3 are coupled to each other through a capacitor 11. The first and second output are coupled to each other through a capacitor 12. The first input 2 is coupled to the second output 5 through a first inductor 13. The second input 3 is coupled to the first output 4 through a second inductor 14.

The prior art combiner device 20 illustrated in FIG. 1B also has first and second inputs 2, 3 coupled to each other through a capacitor 21, and first and second outputs 4 and 5 coupled to each other through a second capacitor 22. This combiner device 20 further comprises two transmission lines 23, 24 implemented as a coax cable having a characteristic impedance of 50 Ohm, and having a length of ⅛λ. Each transmission line 23, 24 has a core conductor or inner conductor surrounded by a shield conductor or outer conductor 25, 26. The first input 2 is coupled to the second output 5 via the inner conductor of the first transmission line 23, and the second input 3 is coupled to the first output 4 via the inner conductor of the second transmission line 24. The first transmission line 23 has an input end 23a and an output end 23b; similarly, the second transmission line 24 has an input end 24a and an output end 24b. At their respective input and output ends 23a, 23b, 24a, 24b, the outer conductors of both transmission lines 23, 24 are connected to ground.

In operation, two receiver coils (not shown) are connected to the two inputs 2, 3 by corresponding conductors (not shown), which are typically shielded by a common cylindrical shield conductor (not shown) extending around both conductors, which shield conductor is connected to the input ends of the outer conductors of the transmission lines 23, 24.

These prior art combiner devices suffer from various drawbacks. One drawback is that they take up relatively much space. A second drawback is that they are not capable of blocking mantle currents induced in said shield conductor enveloping the two signal conductors from the two receiver coils. Therefore, in order to effectively block these undesired currents, additional parts are necessary, which increase the amount of space necessary, and involve additional costs. Furthermore, in view of the increased overall length of electrical paths, the circuit as a whole will pick up more noise.

FIG. 1C illustrates a prior art assembly 30 comprising the prior art combiner device 20 illustrated in FIG. 1B, extended by a third transmission line 35 connected between first output 4 and a receiver (not shown). More particularly, this third transmission line 35 has an outer conductor 36 with an input end 36a and an output end 36b, and an inner conductor 37 with an input end 37a and an output end 37b. The input and output ends 36a, 36b of the outer conductor 36 are connected to ground. The input end 37a of the inner conductor 37 is connected to said first output 4 of said prior art combiner device 20. A part of the length of this third transmission line 35 is used for forming a trap to block said above-mentioned mantle currents. In this prior art assembly 30, a cylindrical conductor 38 is arranged coaxially around the third transmission line 35. The cylindrical conductor 38 has its output end 38b electrically connected to the outer conductor of the third transmission line 35. At its input end 38a, said cylindrical conductor 38 is coupled to said outer conductor 36 of said third transmission line 35, through a capacitor 34. This design also has some drawbacks. First, it is very difficult to find a suitable compromise between on the one hand flexibility of the transmission line 35 and on the other hand an accurate positioning of the transmission line in the center of said cylindrical conductor. Second, in operation, a very high electric field will develop across said capacitor 34, which may be potentially dangerous to humans under examination.

It is an object of the invention to provide an improved combiner/splitter device of the kind mentioned in the opening paragraphs and an improved MRI system of the kind mentioned in the opening paragraphs, which overcome all or at least part of the above-mentioned disadvantages. Specifically, the present invention aims to provide a combiner/splitter device and an MRI system which take up less space, and which is able to give a good protection against mantle currents without any (or with a reduced number of) additional parts.

In order to achieve said object, a combiner/splitter device according to the invention is characterized in that at least a portion of the two transmission lines are wound in parallel to form a helical coil.

In order to achieve said object, an MRI system according to the invention is characterized in that the combiner/splitter device used therein is a combiner/splitter device according to the invention.

The present invention provides a combiner device which is based on two transmission lines, similarly to the prior art combiner device illustrated in FIG. 1B. According to an important aspect of the present invention, these two transmission lines are wound to form a helical coil, this helical coil being bent such that its one end connects to its other end in order to confine field lines. Furthermore, a capacitor is provided, connected in parallel with the two outer conductors of the two transmission lines. The combination of the wound transmission lines and said capacitor forms a parallel resonator.

These and other aspects, features and advantages of the present invention will be further explained by the following description of a preferred embodiment of a combiner device according to the present invention with reference to the drawings, in which same reference numerals indicate same or similar parts, and in which:

FIGS. 1A–C are electrical diagrams schematically illustrating prior art combiner devices;

Figure 1A:
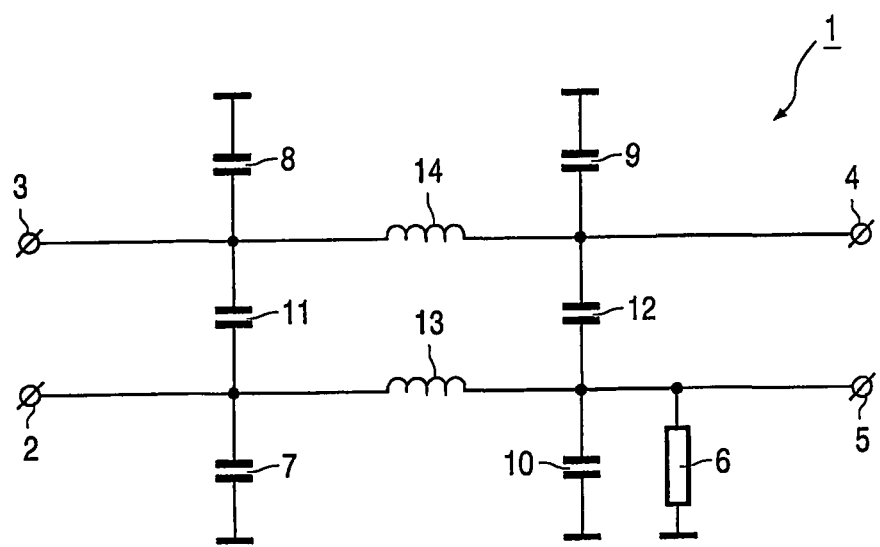
Figure 1B:
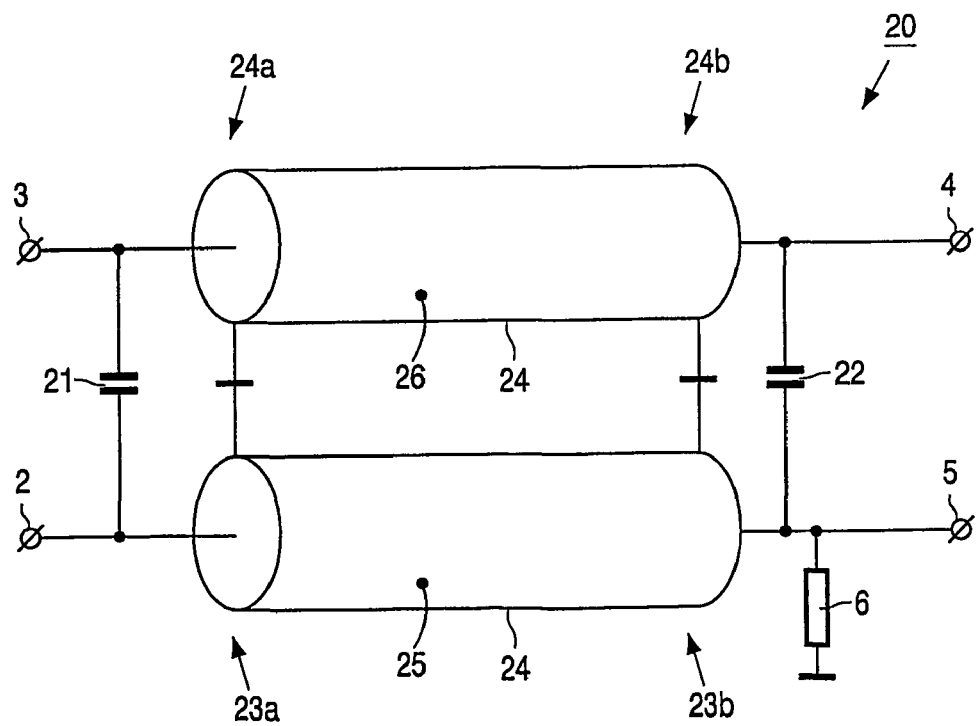
Figure 1C:
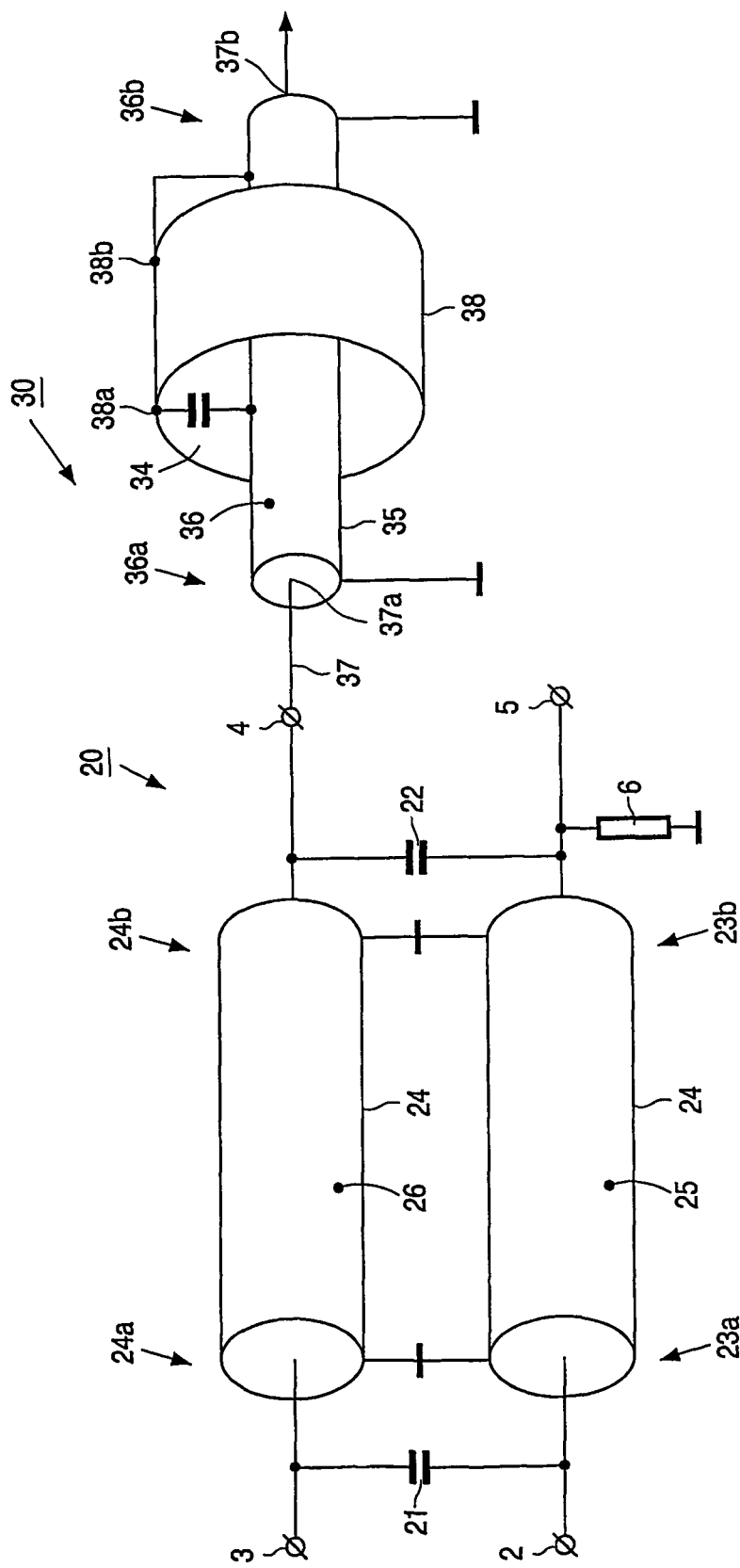
Figure 2:
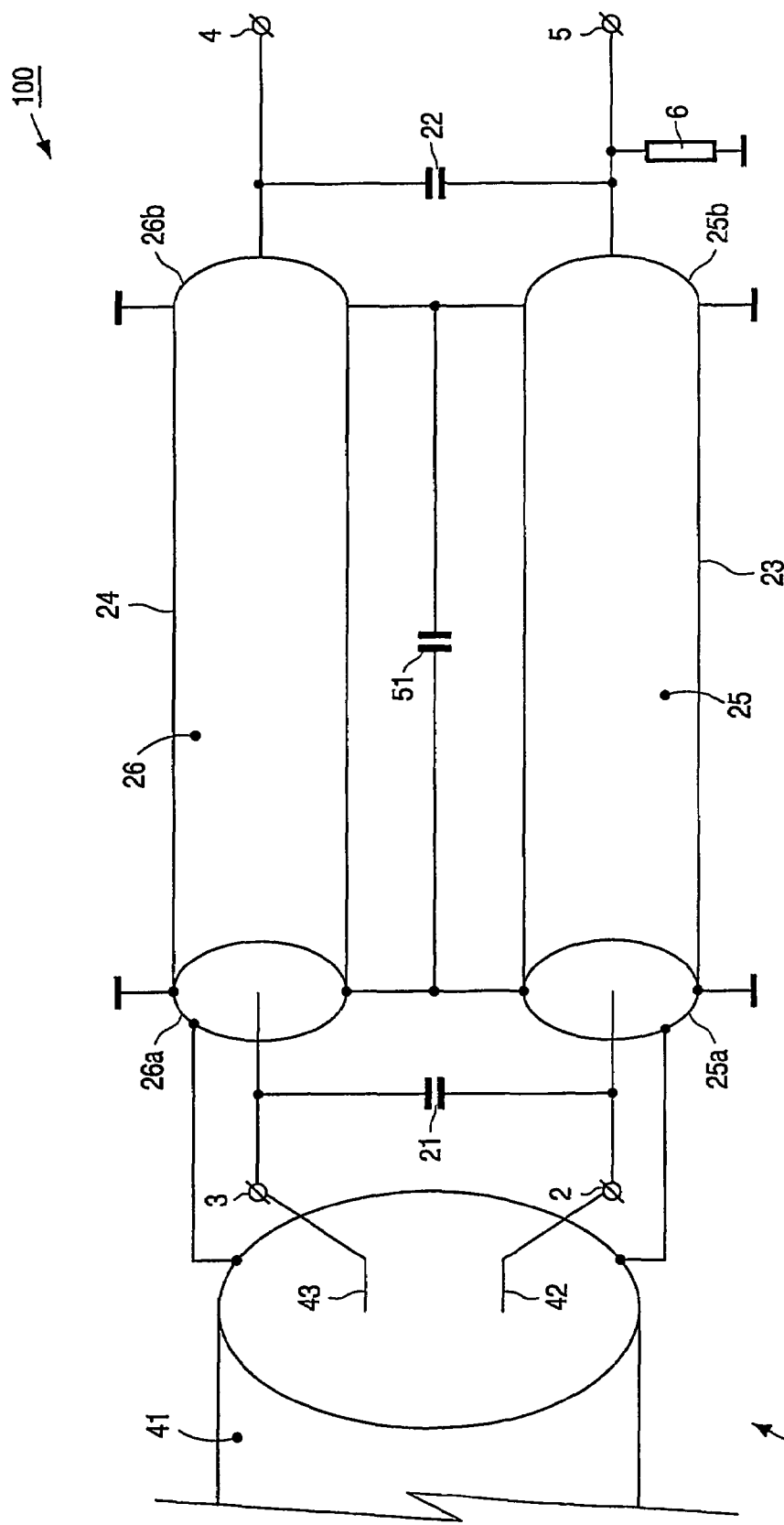
FIG. 2 is an electrical diagram schematically showing an embodiment of a combiner device according to the present invention.

FIG. 2 schematically shows an electrical diagram representing an embodiment of a combiner device 100 according to the present invention. The combiner device 100 is used in a magnetic resonance imaging system according to the invention to combine two output signals of a radio frequency (RF) receiver coil system of the MRI system. It is noted that other parts of the MRI system, such as an examination volume in which a patient to be examined can be placed, a main magnet system for generating a main magnetic field in the examination volume, and a gradient magnet system for generating gradients of the main magnetic field, are not shown in the Figure. These parts may be of a usual kind known to the person skilled in the art. Comparing the embodiment 100 of the present invention as illustrated in FIG. 2 with the prior art embodiment 20 as illustrated in FIG. 1B, it is readily apparent that, electrically, the combiner device 100 of the present invention is similar to the combiner device of FIG. 1B, although preferably, and as illustrated, the combiner device 100 includes a capacitor 51 having one electrode connected to the input ends 25a, 26a of the outer conductors 25, 26 of the two coax transmission lines 23, 24 and having its other electrode connected to the output ends 25b, 26b of the two outer conductors 25, 26 of the two coax transmission lines 23, 24. FIG. 2 also schematically shows a signal cable 40 coming from a pair of quadrature receiver coils (not shown), the cable comprising two signal lines 42, 43 and a common outer conductor 41 functioning as a shielding mantle. A first signal line 42 is connected to the first input 2 of the combiner device 100, and the second signal line 43 is connected to the second input 3 of the combiner device 100. The common outer conductor 41 of the signal cable 40 is connected to the input ends 25a, 26a of the outer conductors 25, 26 of the two coax transmission lines 23, 24 of the combiner device 100. As regards signals being transferred on the signal lines 41, 42 of said signal cable 40, the combiner device 100 of the present invention behaves exactly the same as the prior art combiner device; more particularly, as regards those signals, the capacitor 51 does not play any role.

Figure 3A:
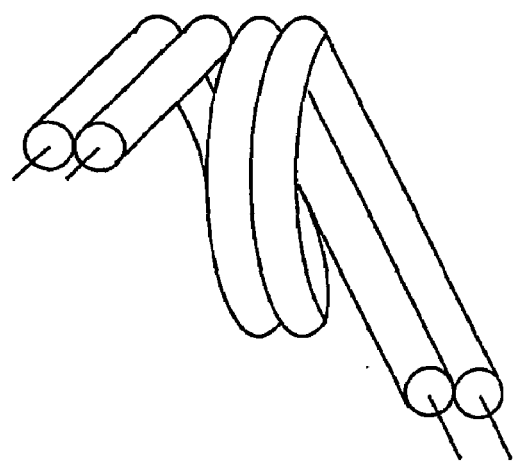
FIG. 3A is a schematical perspective view illustrating a portion of two coaxial transmission lines wound together in a helix configuration.
Figure 3B:
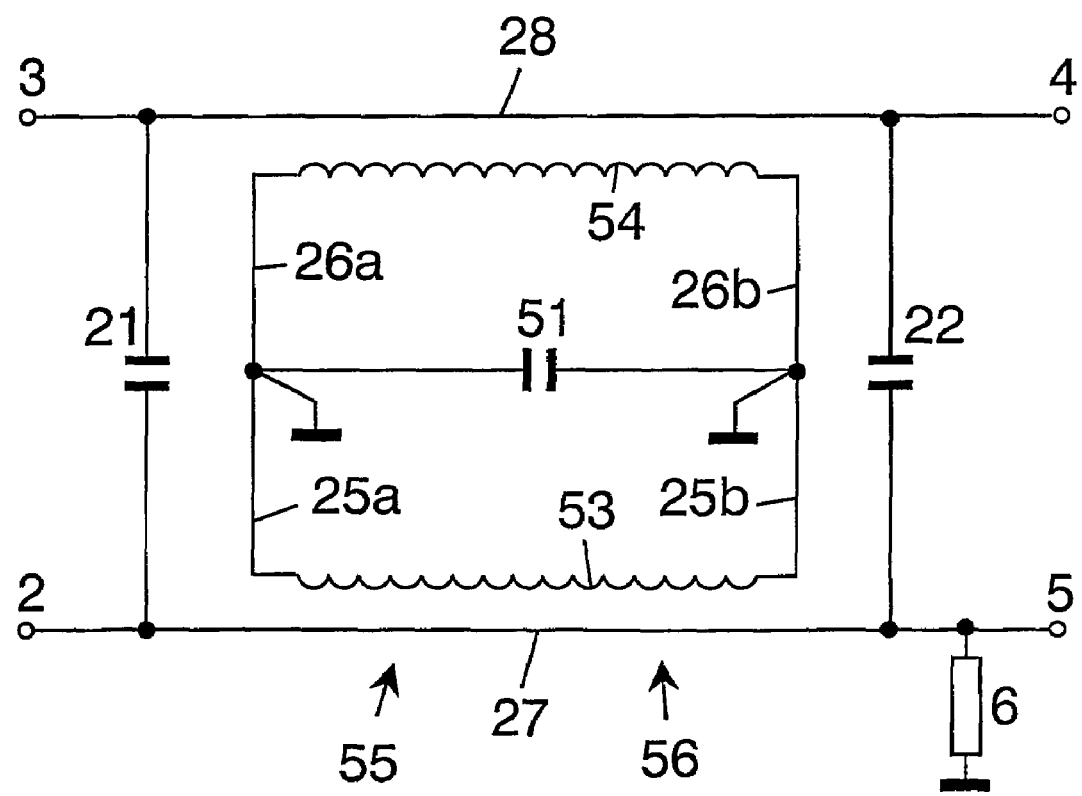
FIG. 3B is an electrical diagram comparable to FIG. 2, showing the inductive properties of the wound coaxial transmission lines.

According to one important aspect of the present invention, schematically illustrated in FIG. 3A, the two coaxial transmission lines 23, 24 are wound together to form a substantially cylindrical configuration, each transmission line 23, 24 now having the form of a helix. Then, each outer conductor 25, 26 behaves as a spiral or coil inductor. Preferably, each outer conductor 25, 26 is provided with an electrically insulating cover in order to prevent short-circuiting between neighboring windings, but this is not shown in the drawing for the sake of simplicity. Because said two outer conductors 25, 26 have their input ends 25a, 26a and their output ends 25b, 26b connected together, and because they are wound in parallel and hence enclose the same flux, they are very strongly coupled and in fact behave as one helix inductor or coil inductor. FIG. 3B is an electrical replacement diagram for the diagram of FIG. 2, in which the two outer conductors 25, 26 of the two coaxial transmission lines 23, 24 are represented as inductors 53, 54 and in which the two inner conductors are indicated at 27, 28. FIG. 3B also shows the above-mentioned additional capacitor 51 connected between on the one hand the input ends 25a, 26a of said two inductors 53, 54, and on the other hand the output ends 25b, 26b of said two inductors 53, 54. It will readily be apparent that this additional capacitor 51 and the self-inductance presented by said two inductors 53, 54 together form a parallel resonance circuit. This parallel resonance circuit presents a very high impedance for mantle currents, i.e. currents that might flow in said common outer conductor 41 of said signal cable 40 due to inductive coupling or capacitive coupling with the transmission coils (not shown). Thus, according to this important aspect of the present invention, such mantle currents are effectively blocked by the outer conductors 25, 26 of the transmission lines 23, 24 themselves, owing to the fact that these outer conductors 25, 26 are configured as inductors 53, 54 by winding them into a cylindrical shape.

The fact that the two outer conductors 25, 26 of the two coaxial transmission lines 23, 24 are wound in a cylindrical configuration offers a further advantage in that such cylindrical configuration occupies relatively little space as compared to the physical length of the coaxial transmission lines (being ⅛λ).

In the following, the wound combination of the two outer conductors 53, 54 of the two coaxial transmission lines 23, 24 will be indicated as transmission line coil 55. The parallel connection of this transmission line coil 55 and the additional capacitor 51 will be indicated as mantle current barrier 56.

The impedance of the mantle current barrier 56 depends, inter alia, on the inductance of the transmission line coil 55. As will be clear to a person skilled in the art, this inductance depends, inter alia, on the diameter of the transmission line coil 55 and on the number of windings. As regards design, one is free, within certain limits, to choose a desirable diameter, bearing in mind that the length of the transmission lines 23, 24 depends on the MR frequency used in the associated apparatus. Furthermore, the diameter of this transmission line coil 55 is constant over its length, although this is not essential.

It is observed that it is not necessary to use the entire length of the transmission lines 32, 24 for winding the transmission line coil 55. A designer might choose to use only a certain portion of the length of the transmission lines 23, 24 for winding the transmission line coil 55, and to leave the remaining portion of the transmission lines 23, 24 linear. One reason for doing this might be that it is desirable to use part of the transmission lines to bridge a certain distance to a signal processing apparatus (not shown). Another reason for doing this is to obtain a transmission line coil whose inductance is smaller than it would have been if the entire transmission line length were used. On the other hand, if the length of the coaxial transmission lines is considered to be insufficient to obtain a certain desired inductance, the length of the transmission line coil can be increased by using at least part of a coaxial output transmission line, connected to output 4, as extension of the transmission line coil.

The transmission line coil 55 in its cylindrical shape as discussed so far is open ended, which means that electromagnetic field lines will reach the surroundings, while the transmission line coil 55 might pick up an electromagnetic field generated by, for instance, a transmission coil. According to a further important aspect of the present invention, illustrated in FIG. 4A, this is avoided by bending the transmission line coil 55 such that its ends meet each other and the electromagnetic field lines are closed while being confined within the windings of the transmission line coil 55. Preferably, the bending radius of the transmission line coil is constant over its length, so that the transmission line coil 55 will assume a toroidal shape. A further advantage of this toroidal shape is that it occupies still less space.

Figure 4A:
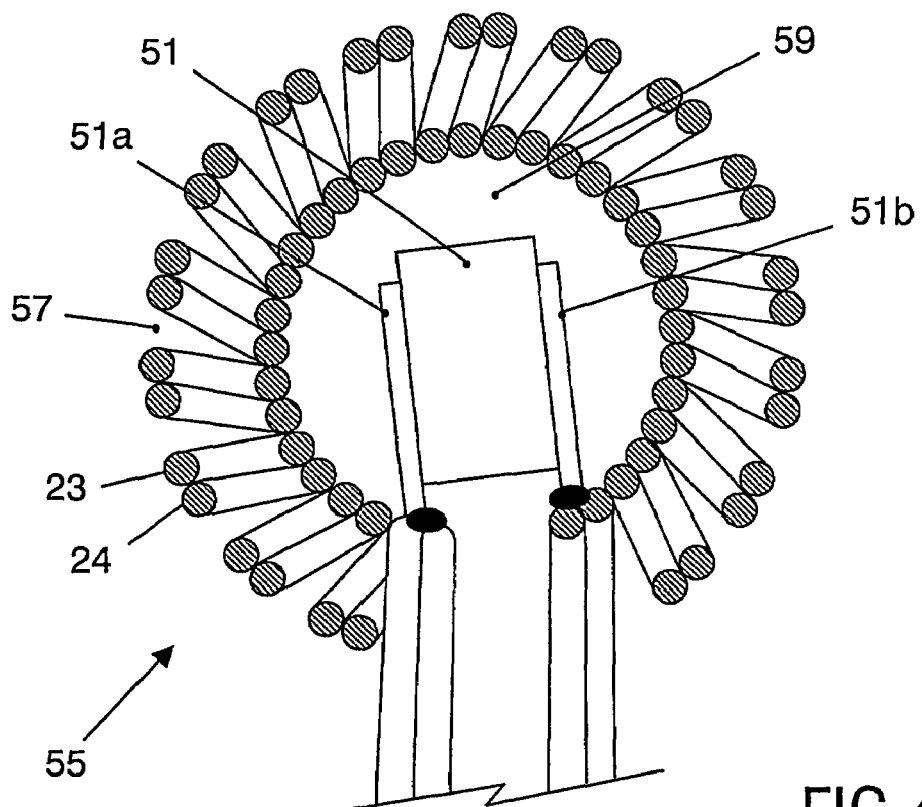
FIGS. 4A–B are schematical views, in cross section, of embodiments of a toroidally bent transmission line coil.

FIG. 4A also shows an additional capacitor 51, having its electrodes 51a, 51b connected directly to the ends of the transmission line coil 55, and having its body located in the circular inner space 59 enclosed by the transmission line coil 55. Thus, the inner space 59 of the transmission line coil 55 is efficiently used, and the additional capacitor 51 does not occupy any additional space. Also, the body of the additional capacitor 51 advantageously reduces the area of the inner space 59 available for flux. In this respect, it is advantageous to use a capacitor type having mutually parallel capacitor plates, as is known per se, and to position the additional capacitor 51 such that its capacitor plates are directed substantially perpendicularly to the central axis of the transmission line coil 55, which central axis is directed substantially perpendicularly to the plane of drawing.

Advantageously, the combination of the transmission line coil 55 and the additional capacitor 51 may be cast in a suitable plastic or the like, to form one integral unit.

If the transmission line coil is cylindrical in shape, as discussed earlier, the subsequent windings of the transmission line coil will be contacting each other, so that little or no stray field will escape between the subsequent windings. However, if it is toroidal in shape, the inner parts of the windings will contact each other, as shown in FIG. 4A, whereas the outer parts of the windings (i.e. at the outer radius of the toroidal shape) may be some distance apart. In other words, at the outer radius of the toroidal shape, intervals 57 may exist between neighboring windings, through which a stray field can escape. According to a further improvement of the present invention, this can be avoided by twisting the transmission lines 23, 24 around each other before winding, the speed of twisting corresponding to the speed of winding, such that, when the twisted transmission lines are wound, two windings correspond to one full twist. As a result, as illustrated in FIG. 4B, it will be possible to obtain a toroidal shape such that, at the inner radius of the toroidal shape, the transmission lines 23, 24 are located inside each other, i.e. substantially at the same radial line, and, at the outer radius of the toroidal shape, the transmission lines 23, 24 are located next to each other at the same radius without gaps, so that the amount of stray field escaping is reduced.

Figure 4B:
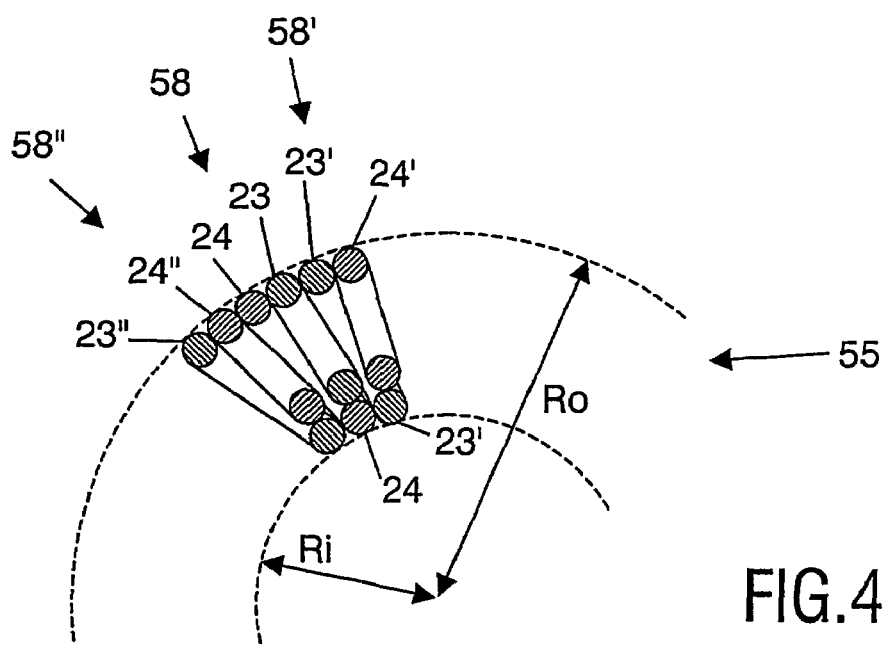

In FIG. 4B, an inner radius of the toroidal coil 55 is indicated at Ri, and an outer radius of the toroidal coil 55 is indicated at Ro. Only three windings 58, 58', 58" are shown. At the outer radius Ro of the toroidal coil 55, the transmission lines 23, 24 of one winding 58 are located at the same radius Ro, the circumferential size of the winding 58 being twice the diameter of the transmission lines 23, 24. A transmission line 23 of one winding 58 contacts the opposite transmission line 24' of the neighboring winding 58'. At the inner radius Ri of the toroidal coil 55, the transmission lines 23, 24 of one winding 58 are located on a radial line and, therefore, at different radii, the circumferential size of the winding 58 here being one time the diameter of the transmission lines 23, 24. An innermost transmission line 24 of one winding 58 contacts the opposite transmission line 23' of the neighboring winding 58', while the other transmission line 23 of said one winding 58 almost contacts the opposite, other transmission line 24' of the neighboring winding 58'.

It should be clear to a person skilled in the art that the present invention is not limited to the exemplary embodiments discussed above, but that various variations and modifications are possible within the protective scope of the invention as defined in the appending claims.

For instance, in the example discussed above, the transmission lines 23, 24 are wound over their entire length, such that the output ends 25b, 26b of the outer conductors 25, 26 also are the output end of the transmission line coil 55. However, as mentioned above, it may be desirable to wind only part of the length of the transmission lines 23, 24. In that case, the input end and/or the output end of the transmission line coil 55 will not coincide with the output ends 25b, 26b of the outer conductors 25, 26. It is to be understood that the additional capacitor 51 should preferably be connected in parallel with the transmission line coil 55, i.e. its electrodes should be connected to the actual input end of the windings of the transmission line coil 55 and to the actual output end of the windings of the transmission line coil 55, respectively.

Furthermore, the transmission line coil 55 may be extended by a coaxial output transmission line having an input end of its inner conductor connected to the signal output 4 of said second transmission line 24, and having an input end of its outer conductor connected to the output ends 25b, 26b of said two transmission lines 23, 24. Then, part of the windings of said helical transmission line coil 55 may be formed by winding the transmission lines 23, 24, and part of the windings of said helical transmission line coil 55 may be formed by winding at least a portion of the output transmission line. Likewise, it is to be understood that the additional capacitor 51 should preferably be connected in parallel with the transmission line coil 55, so that in this case the capacitor 55 will have one electrode connected to the outer conductor of the output transmission line, at the location where the windings of the output transmission line end.

In the above, the device 100 has been described as a combiner device for receiving output signals of a quadrature receiver coil system of an MRI system and for combining those output signals received at its inputs 2, 3 to provide an enhanced output signal at its first output 4. However, the same device 100 can also be used as a splitter device for receiving a drive signal from a control unit of the MRI system and providing two 90° drive output signals to the coils of a quadrature transmission coil system. In that case, the terminal 4 will be coupled as input receiving said drive signal, and the terminals 2, 3 will be coupled as outputs providing said two drive output signals. No modifications need be made to the design of the device 100. In fact, at the option of the user, the same device may be used both as a combiner device and as a splitter device, the difference only residing in which terminal(s) must be connected as input(s) and which terminal(s) must be connected as output(s). Therefore, the device 100, when not connected, will also be termed a combiner/splitter device.

The invention claimed is:

1. A combiner/splitter device comprising:
 a first transmission line, which has an inner conductor and an outer conductor having a first end and a second end, a second transmission line, which has an inner conductor and an outer conductor having a first end and a second end, the first ends of the first and second transmission lines being electrically connected to each other and the second ends of the first and second transmission lines being electrically connected to each other, at least a portion of the first and second transmission lines being wound in parallel into a multiplicity of turns to define a helical coil.

2. A combiner/splitter device as claimed in claim 1, wherein the combiner/splitter device further comprises:
 a capacitor having one electrode connected to the first ends of the outer conductors of the first and second transmission lines and having its other electrode connected to the second ends of the outer conductors of the first and second transmission lines.

3. A combiner/splitter device as claimed in claim 1, wherein said helical coil is bent such that its two opposite ends face each other in order to substantially confine field lines.

4. A combiner/splitter device as claimed in claim 1, wherein said first and second transmission lines are completely parallel.

5. A combiner/splitter device as claimed in claim 1, wherein said first and second transmission lines are twisted around each other.

6. A combiner/splitter device as claimed in claim 5, wherein the speed of twisting corresponds to the speed of winding, such that two windings correspond to one full twist.

7. A combiner/splitter device as claimed in claim 1, wherein the combiner/splitter device further comprises:
 a first capacitor coupled between first ends of the inner conductors, and a second capacitor coupled between second ends of the inner conductors.

8. A magnetic resonance imaging (MRI) system comprising an examination volume, a main magnet system for generating a main magnetic field in the examination volume, a gradient magnet system for generating gradients of the main magnetic field, a transmission and/or receiver coil system, and a combiner/splitter device as claimed in claim 1 to combine at least two output signals of the coil system and/or to split an input signal of the coil system.

9. A combiner/splitter device including:
 first and second transmission lines, each including corresponding first and second inner and outer conductors, at least a portion of the first and second transmission lines being wound in parallel around a helix axis, which helix axis bends along a constant bending radius to define a toroidal shape.

10. A combiner/splitter device as claimed in claim 9, further including:
 a capacitor which is positioned inside an inner space of said toroidal shape, a first electrode of the capacitor being connected to first ends of the first and second outer conductors and a second electrode of the capacitor being connected to second ends of the first and second outer conductors.

11. A magnetic resonance imaging (MRI) system comprising an examination volume, a main magnet system for generating a main magnetic field in the examination volume, a gradient magnet system for generating gradients of the main magnetic field, a transmission and/or receiver coil system, and a combiner/splitter device as claimed in claim 9 to combine at least two output signals of the coil system and to split an input signal of the coil system.

12. A combiner/splitter device including:
 a first transmission line including:
  first inner and outer conductors, each having a corresponding first and second end;
 a second transmission line including:
  a second inner conductor having first and second ends, the first ends of the first and second inner conductors being electrically coupled to one another, and the second ends of the first and second inner conductors being electrically coupled to one another, and
  a second outer conductor, having first and second ends, the first ends of the first and second outer conductors being electrically coupled to one another and the second ends of the first and second outer conductors being electrically coupled to one another; and a third transmission line including:
  a third inner conductor having a first end, which is electrically coupled to the second end of said second inner conductor, and
  a third outer conductor having a first end which is electrically coupled to the second ends of said outer conductors of the first and second transmission lines,
at least a portion of the first and second transmission lines being wound in parallel to define at least a first portion of a helical coil and the third transmission line being wound to define at least a second portion of the helical coil.

13. A magnetic resonance imaging (MRI) system comprising an examination volume, a main magnet system for generating a main magnetic field in the examination volume, a gradient magnet system for generating gradients of the main magnetic field, a transmission and/or receiver coil system, and a combiner/splitter device as claimed in claim 12 to combine at least two output signals of the coil system and to split an input signal of the coil system.

14. A combiner/splitter as claimed in claim 12 wherein the first, second and third transmission lines are would into a multiplicity of turns.

* * * * *